United States Patent
Davies, Jr.

(10) Patent No.: US 6,838,924 B1
(45) Date of Patent: Jan. 4, 2005

(54) DUAL STAGE LEVEL SHIFTER FOR LOW VOLTAGE OPERATION

(75) Inventor: Thomas J. Davies, Jr., Albuquerque, NM (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/423,766

(22) Filed: Apr. 25, 2003

(51) Int. Cl.[7] .................................................. H03L 5/00
(52) U.S. Cl. ............................ 327/333; 326/63; 326/68
(58) Field of Search ........................... 327/333; 326/63, 326/68, 80, 81

(56) References Cited

U.S. PATENT DOCUMENTS

| | | | | |
|---|---|---|---|---|
| 5,399,915 A | * | 3/1995 | Yahata ......................... | 327/108 |
| 5,552,698 A | * | 9/1996 | Tai et al. ...................... | 323/313 |
| 5,559,996 A | * | 9/1996 | Fujioka ........................ | 703/23 |
| 5,872,476 A | * | 2/1999 | Mihara et al. ................ | 327/333 |
| 6,043,699 A | * | 3/2000 | Shimizu ....................... | 327/333 |
| 6,087,880 A | * | 7/2000 | Takagi ......................... | 327/333 |
| 6,157,361 A | * | 12/2000 | Kubota et al. ............... | 345/100 |
| 6,242,962 B1 | * | 6/2001 | Nakamura ................... | 327/333 |
| 2002/0180508 A1 | * | 12/2002 | Kanno et al. | |
| 2003/0137336 A1 | * | 7/2003 | Okamoto et al. | |

* cited by examiner

Primary Examiner—Tuan T. Lam
(74) Attorney, Agent, or Firm—Justin Liu

(57) ABSTRACT

A level shifter for low voltage operation includes two level shifting stages. The first stage shifts the input voltage level to an intermediate voltage level, and the second stage shifts the intermediate voltage level to an output voltage level. This two-stage arrangement allows the level shifter to function for very low input voltages, and enables functionality across a wide range of output voltages. The first stage is designed to be compatible with very low input voltages and the intermediate voltage level is chosen to be within the safe operating limits of the first stage. The intermediate voltage level is also high enough to drive the high voltage devices of the second stage. This level shifter can be used where multiple output voltage levels are required depending on the particular application or operating mode.

17 Claims, 3 Drawing Sheets

DUAL STAGE LEVEL SHIFTER FOR LOW VOLTAGE OPERATION

FIELD OF THE INVENTION

The invention relates to integrated circuits, and, more particularly, to level shifters.

BACKGROUND OF THE INVENTION

One challenge in designing integrated circuits (ICs) is accommodating several different power supply voltages on a single IC. Typically, an IC will have a "core" power supply for powering the bulk of its internal circuitry. The voltage level of the core power supply is usually kept low in order to conserve power. As IC fabrication processes improve and the minimum feature size on an IC decreases, the allowable core voltage also decreases. ICs fabricated using current IC processes can typically operate at approximately 1.0V, and even lower voltages will be possible soon, as process technology continues to improve.

For particular applications, however, an IC can require the use of one or more other voltage levels, usually higher than the core voltage. For example, an IC may need to communicate with other components in a system using an input/output (I/O) standard that requires a particular voltage level for compliance (e.g., the TTL standard, which may require a voltage level of 3.3V). The low voltage core of the IC is electrically separated from the high voltage I/O, and the core and I/O are each coupled to their own power supplies.

In another example, a section of the IC may require a special power supply in order to perform a particular function. For instance, certain types of nonvolatile memory circuits need a high voltage (e.g. 10.0–14.0V) to write or erase a memory cell. An IC that includes such nonvolatile memory can use a separate high voltage power supply (which can be provided by an external source or produced on the IC itself) for writing or erasing nonvolatile memory cells. The high voltage power supply and the circuits that use it can be segregated from other sections of the core that operate at a different, lower voltage level.

There are many other examples of applications that can require the use of multiple voltage levels. In such applications, level shifters are used to communicate between two sections of an IC using different voltage supplies. A level shifter is a type of circuit that translates logical signals using one voltage level to logical signals using another voltage level. For example, a level shifter can take a signal having a low voltage supply equal to VDD, where a logic low corresponds to 0V and a logic high corresponds to VDD, as an input. The level shifter translates this input signal to an identical logical signal at a high voltage level VPP, where a logic low corresponds to 0V and a logic high corresponds to VPP. In an example, VDD can be a core voltage of 1.0V and VPP can be a high voltage of 12.0V for writing and erasing nonvolatile memory. In this example, the level shifter shifts input signals in the range 0V–1.0V to output signals in the range 0V–12.0V.

An example of a prior art level shifter is shown in FIG. 1. Level shifter 100 includes NMOS transistors 115 and 125, PMOS transistors 113 and 123, and inverter 130. Transistors 115, 125, 113, and 123 are thick oxide transistors, while transistors 133 and 135, which form inverter 130, are thin oxide transistors. Their thicker gate oxide allows transistors 115, 125, 113, and 123 to tolerate the greater voltages that can be imposed by the high voltage supply.

Level shifter 100 shifts an input signal at its input terminal A, having a voltage range of 0V to VDD, to an output signal at its output terminal Y, having a voltage range of 0V to VPP. For example, VDD can be 1.8V and VPP can be 3.3V. A logic low (0V) at input terminal A of level shifter 100 results in a logic low (0V) at output terminal Y. A logic high, corresponding to a voltage of 1.8V (VDD), at input terminal A of level shifter 100 results in a logic high, corresponding to a voltage of 3.3V (VPP), at output terminal Y.

In some applications, it would be advantageous to be able to use a single level shifter that can shift to different voltage levels. A single level shifter would allow for more efficient use of the resources on an IC and simplifies the design of the IC. For instance, as noted above, some types of nonvolatile memory use a very high voltage (e.g., 12.0V) to write or erase data, but use a lower voltage (e.g., 1.8V) to retrieve the stored data. In this type of memory application, it can be advantageous to use a single level shifter that can be powered by one of a plurality of voltage levels to drive inputs to the memory. A user can select the proper voltage level to power the level shifter depending on the intended operation (e.g., read, write, or erase).

A PLD is a well-known type of digital integrated circuit that can be programmed to perform specified logic functions, and that can include nonvolatile memory. Types of PLDs include the field programmable gate array (FPGA), and the complex programmable logic device (CPLD). PLDs typically include various programmable resources, such as configurable logic blocks (CLBs), programmable input/output blocks (IOBs), and programmable interconnect structures, and can also include special purpose blocks such as DLLs, RAM, multipliers, and processors. The functionality of a PLD is typically controlled by data bits provided to the device for that purpose. In some PLDs, these data bits are stored in nonvolatile memory. Level shifters can be useful in such PLDs, and other types of ICs, for example, for accessing nonvolatile memory cells that require high voltages for some modes of operation, and lower voltages for other operations.

One problem associated with prior art level shifters is that they only operate over a limited range of voltages. Limitations in process technology can restrict the range of acceptable input and output voltages for a level shifter. For instance, as described above, level shifter 100 consists of high voltage transistors that can tolerate the high voltage power supply and the high voltage output swing. However, the high voltage transistors also have high threshold voltages, and therefore cannot operate at very low voltages. The voltage swing of the input to level shifter 100 must exceed this threshold voltage in order for the level shifter to function. As minimum feature sizes shrink, the correspondingly decreasing core voltages only exacerbate this problem.

Therefore, a need exists for a single level shifter that is capable of shifting to multiple output voltage levels. Furthermore, a need exists for a single level shifter that can function for very low input voltages and across a wide range of high output voltages.

SUMMARY OF THE INVENTION

In accordance with the present invention, a level shifting circuit includes two stages. The first stage shifts an input signal to an intermediate voltage level, and the second stage shifts the intermediate voltage level to an output voltage level. The intermediate voltage level is designed to be at a level within the safe operating ranges of the first and second stages. For instance, the intermediate voltage level can be designed to be below the maximum voltage tolerable by the first stage, and above the minimum voltage for functionality of the second stage. This enables the level shifter to function at very low input voltages and over a wide range of output voltages. In one embodiment, each stage of the level shifter comprises a pair of cross-coupled PMOS transistors and a pair of input NMOS transistors. In some embodiments, the level shifter further includes an output buffer stage.

BRIEF DESCRIPTION OF THE DRAWINGS

The present invention is illustrated by way of example, and not by way of limitation, in the following figures, in which like reference numerals refer to similar elements.

DETAILED DESCRIPTION

The present invention is believed to be applicable to a variety of integrated circuits and systems. The present invention has been found to be particularly applicable and beneficial for certain nonvolatile memory circuits. While the present invention is not so limited, specific examples and details for nonvolatile memory circuits are set forth to provide a more thorough understanding of the present invention. However, it will be apparent to one ordinarily skilled in the art that the present invention can be practiced without these specific details, and can be practiced within other architectural variations.

Figure 1:
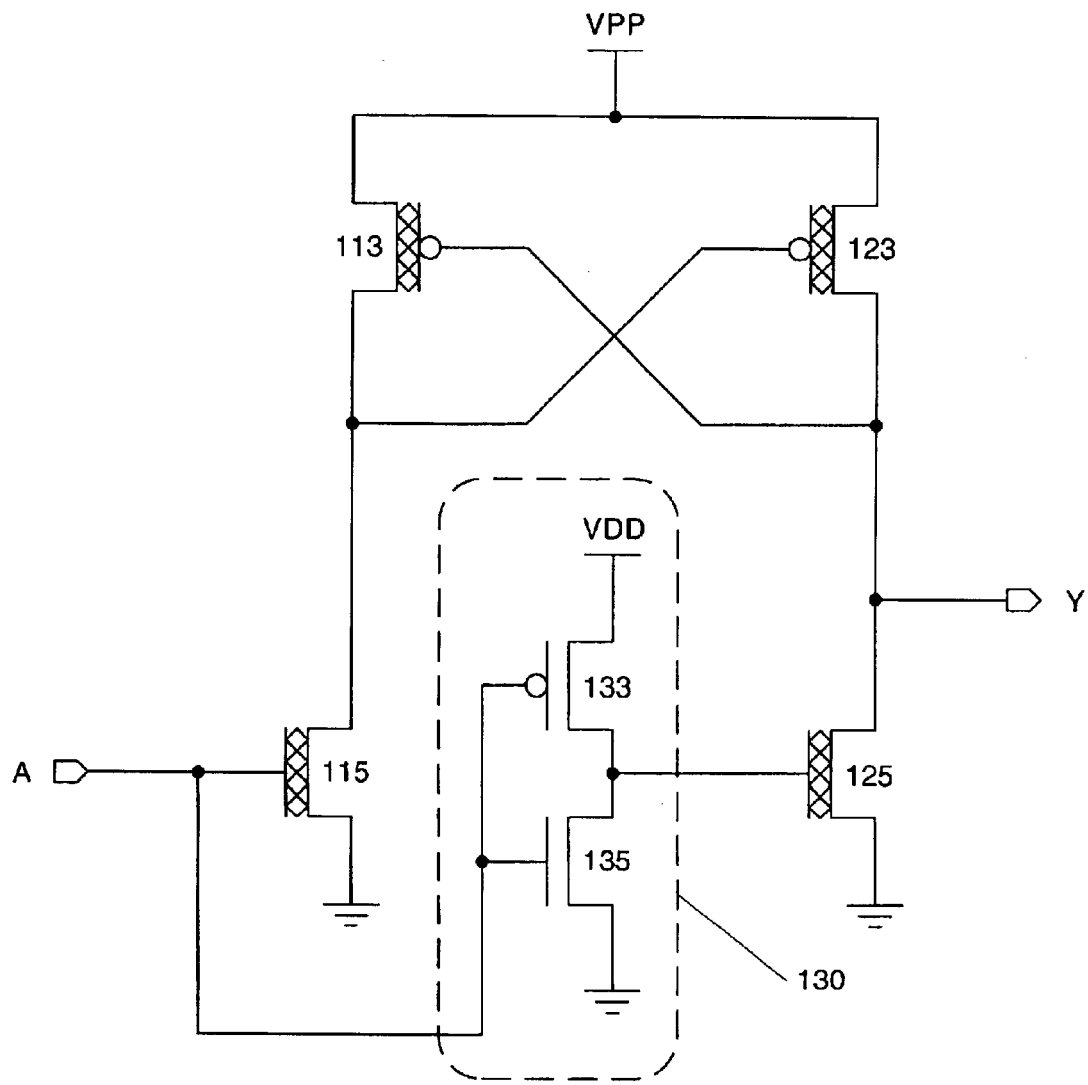
FIG. 1 shows a prior art level shifter.
Figure 2:
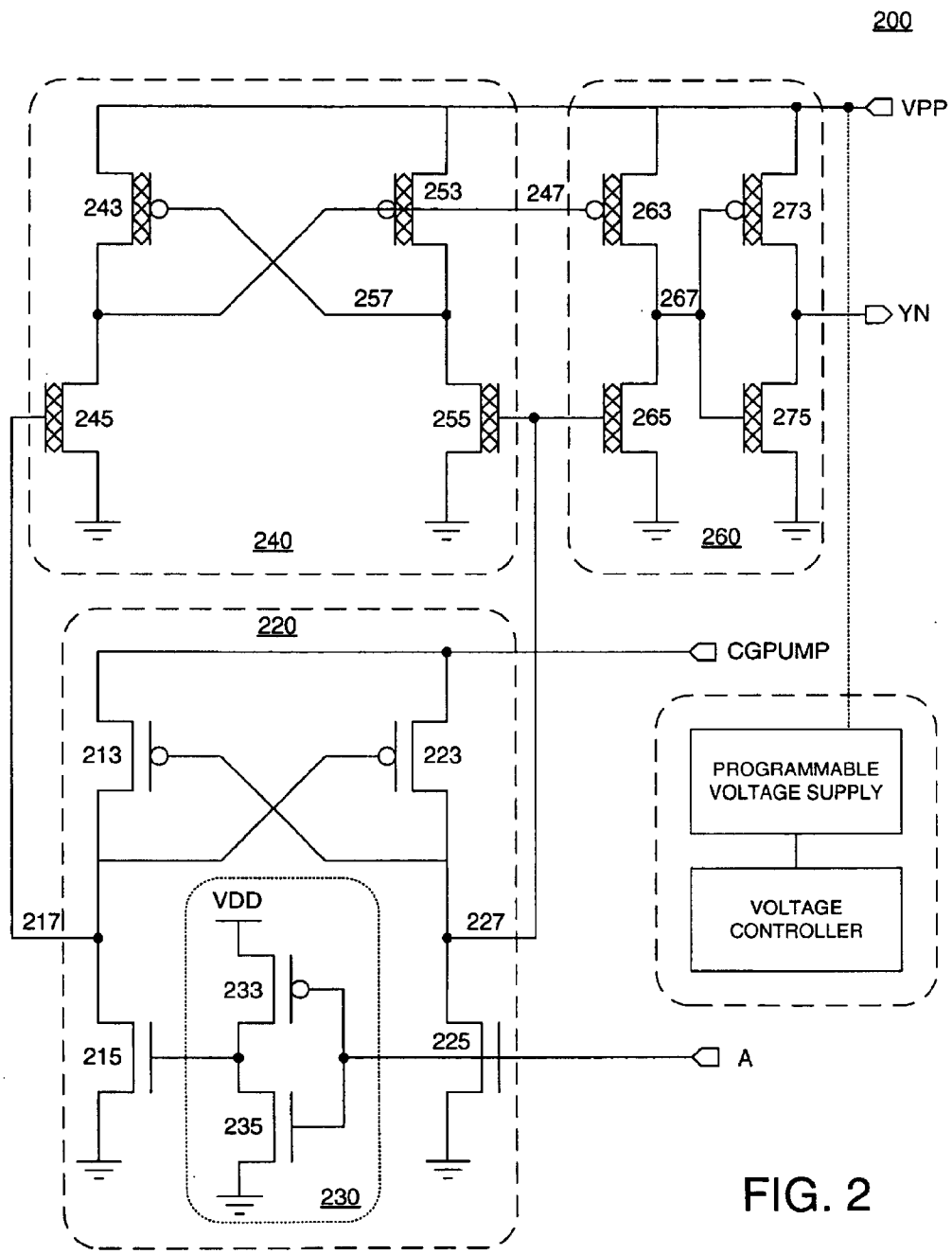
FIG. 2 shows a level shifter in accordance with the present invention.

FIG. 2 shows a circuit diagram of a level shifter 200 in accordance with the present invention. Level shifter 200 includes a first stage 220 and a second stage 240. Input A of level shifter 200 is configured to receive a low voltage input signal. The low voltage input signal is shifted to a high voltage output signal at node 247 of level shifter 200. As shown in FIG. 2, the input signal has a voltage swing of 0V to VDD (corresponding to a logic low and a logic high, respectively), and the output signal has a voltage swing of 0V to VPP (corresponding to a logic low and a logic high, respectively). In one example, VDD can be a core voltage (e.g., 1.0V) and VPP can be a voltage for writing and erasing nonvolatile memory cells (e.g., 12.0V). Note that as shown in FIG. 2, level shifter 200 is an inverting level shifter. That is, the output of level shifter 200 is the logical inverse of its input. However, it will be readily apparent to one of ordinary skill in the art that straightforward circuit modifications can be made such that the level shifter is non-inverting.

In accordance with the present invention, first stage 220 of level shifter 200 shifts the input signal to an intermediate voltage range, 0V to CGPUMP. Second stage 240 then shifts the intermediate signal to an output voltage range, 0V to VPP. Voltage sources CGPUMP and VPP can be generated on chip, or can be supplied by external sources. In some modes of operation VPP can be at a voltage level equal to CGPUMP. For example, VPP and CGPUMP can both be equal to 1.8V, meaning the output voltage swing of the level shifter is 0V to 1.8V, when the level shifter is used to retrieve data from a nonvolatile memory cell. In other modes of operation, VPP can be modified to be a voltage level not equal to CGPUMP. For example CGPUMP can be 1.8V and VPP can be raised to 12.0V for an output voltage swing of 0V to 12.0V when the level shifter is used to write or erase data of a nonvolatile memory cell. In accordance with the present invention, the voltage level of VPP can be modified while the level shifter is in operation. Configuring the level shifter into two stages advantageously enables the level shifter to shift a very low voltage input (e.g., 1.0V and below) to a very high output voltage (e.g., 12.0V and above). This advantage becomes increasingly important as minimum feature size and core voltages decrease.

First stage 220 of level shifter 200 is powered by an intermediate power source CGPUMP, and therefore produces an output signal having a voltage swing of 0V to CGPUMP. In one example, CGPUMP can be 1.8V. CGPUMP can be generated on chip by, for example, a charge pump, or by other means, or CGPUMP can be supplied by an external source. First stage 220 produces complementary outputs at nodes 217 and 227 representing a level shifted version of the input signal received at input terminal A. That is, first stage 220 of level shifter 200 translates input signal A from an input voltage range of 0V-VDD to an intermediate voltage range of 0V-CGPUMP at complementary output nodes 217 and 227.

In one embodiment, first stage 220 comprises low voltage PMOS transistors 213, 223, and 233, and low voltage NMOS transistors 215, 225, and 235. Transistors 233 and 235 form an inverter 230 that drives the gate of transistor 215 with an inverted version of input A. PMOS transistors 213 and 223 have their gates and drains cross-coupled, and are also coupled to the drains of transistors 215 and 225. When the input signal at A is a logic low (corresponding to 0V), transistor 225 is off and transistor 215 is on, pulling output node 217 to ground (logic low). Transistor 223 is on, since its gate is driven low by node 217, and drives output node 227 to CGPUMP (logic high). When the input signal at A is a logic high (corresponding to VDD), transistor 215 is off and transistor 225 is on, pulling output node 227 to ground (logic low). Transistor 213 is on, since its gate is driven low by node 227, and drives output node 217 to CGPUMP (logic high). Thus, the signal at node 217 is logically identical to input signal A, and the signal at node 227 the logical inverse of input signal A. However, input signal A has a voltage range of 0V-VDD, whereas complementary output nodes 217 and 227 have a voltage range of 0V-CGPUMP.

Second stage 240 receives the outputs from first stage 220, and shifts those signals to an output signal having a voltage swing of 0V to VPP. For certain applications or operational modes, VPP can be equal to CGPUMP. In other applications or modes, VPP is a voltage greater than CGPUMP. Level shifter 200 can function across a wide range of possible voltages for VPP, and the voltage level of VPP can be changed when level shifter 200 is in operation. As VPP changes, the output voltage swing will also change while maintaining the level shifter's functionality. Similarly to CGPUMP, VPP can be generated on chip by a charge pump, or by other means, or VPP can be supplied by an external source. In accordance with the invention, the second stage can be powered by a programmable voltage supply, and the appropriate voltage level VPP can be selected by a voltage controller connected to the programmable voltage supply.

In the embodiment shown in FIG. 2, second stage 240 comprises high voltage PMOS transistors 243 and 253, and high voltage NMOS transistors 245 and 255. The gates and drains of transistors 243 and 253 are cross-coupled and are also coupled to the drains of transistors 245 and 255. The complementary output from first stage 220 is received at the gates of transistors 245 and 255 (nodes 217 and 227). As described above, when input A is a logic low, node 217 is a logic low (0V), meaning transistor 245 is off, and node 227 is a logic high (CGPUMP), meaning transistor 255 is on.

Transistor 255 pulls node 257 low, turning on transistor 243, and pulling output node 247 to VPP, corresponding to a logic high. When the input A is a logic high, polarities are reversed, and the output at node 247 is a logic low (0V).

The high voltage transistors forming second stage 240 differ from the low voltage transistors forming first stage 220 in that they are able to tolerate greater voltages. Typically, this means the high voltage transistors have a thicker gate oxide that allows for a greater voltage to be applied before breakdown occurs. The thicker gate oxide also means the threshold voltage is increased for the high voltage transistors. In a preferred embodiment, CGPUMP is chosen and regulated to a voltage level that is below the maximum voltage that can be tolerated by the low voltage transistors, and is also above the threshold voltage of the high voltage transistors. Advantageously, this ensures that the low voltage transistors are not subject to extreme voltages and that they will not be damaged, while allowing the level shifter to maintain its functionality. For instance, CGPUMP can be chosen and regulated to be 1.8V, corresponding to an intermediate voltage level that is less than the maximum voltage of the first stage and greater than the minimum voltage of the second stage. In one example, the output voltage VPP can alternate between 1.8V and 12.0V, depending on operating mode of the level shifter.

In some embodiments, level shifter 200 further includes an output buffer stage 260. Buffer stage 260 allows level shifter 200 to drive heavier loads. As shown in FIG. 2, buffer stage 260 can comprise high voltage PMOS transistors 263 and 273, and high voltage NMOS transistors 265 and 275. High voltage transistors are used since buffer stage 260 is also powered by VPP, and transistors 263, 265, 273, 275 must be capable of tolerating the maximum possible VPP voltage level. Output buffer stage 260 receives the output signal from second stage 240 and produces a buffered output signal YN. Output YN is logically equivalent to the output from second stage 240 at node 247, and is the logical inverse of input A. In one embodiment, the buffer stage can comprise two cascaded inverters driven by the output at node 247 from second stage 240. In another embodiment, in order to reduce the loading on node 247, only PMOS transistor 263 is driven by output node 247. NMOS transistor 265 can then be driven by node 227. Node 227 is logically equivalent to node 247, but node 227 has a voltage swing of 0V-CGPUMP, whereas node 247 has a voltage swing of 0V-VPP. However, since CGPUMP can be set at a voltage level above the threshold voltage of the high voltage transistors, the voltage swing of 0V-CGPUMP is sufficient to switch transistor 265. Furthermore, the logic low voltage of 0V at node 227 ensures that transistor 265 is fully turned off when transistor 263 is on, thereby minimizing the static current drawn by buffer stage 260. The transistors of output buffer stage 260 can be appropriately sized depending on the size of the load they must drive. Other techniques and circuits for buffering will be known to those of ordinary skill in the art.

As noted above, although level shifter 200 is an inverting level shifter, it will be apparent to those of ordinary skill in the art that straightforward modifications of level shifter 200 can make it a non-inverting level shifter. For example, nodes 257 and 217 can be substituted for nodes 247 and 227, respectively. That is, a non-inverting level shifter can be realized by driving transistor 263 with node 257, and driving transistor 265 with node 217. As another example, a non-inverted output signal Y can be derived from node 267.

Figure 3:
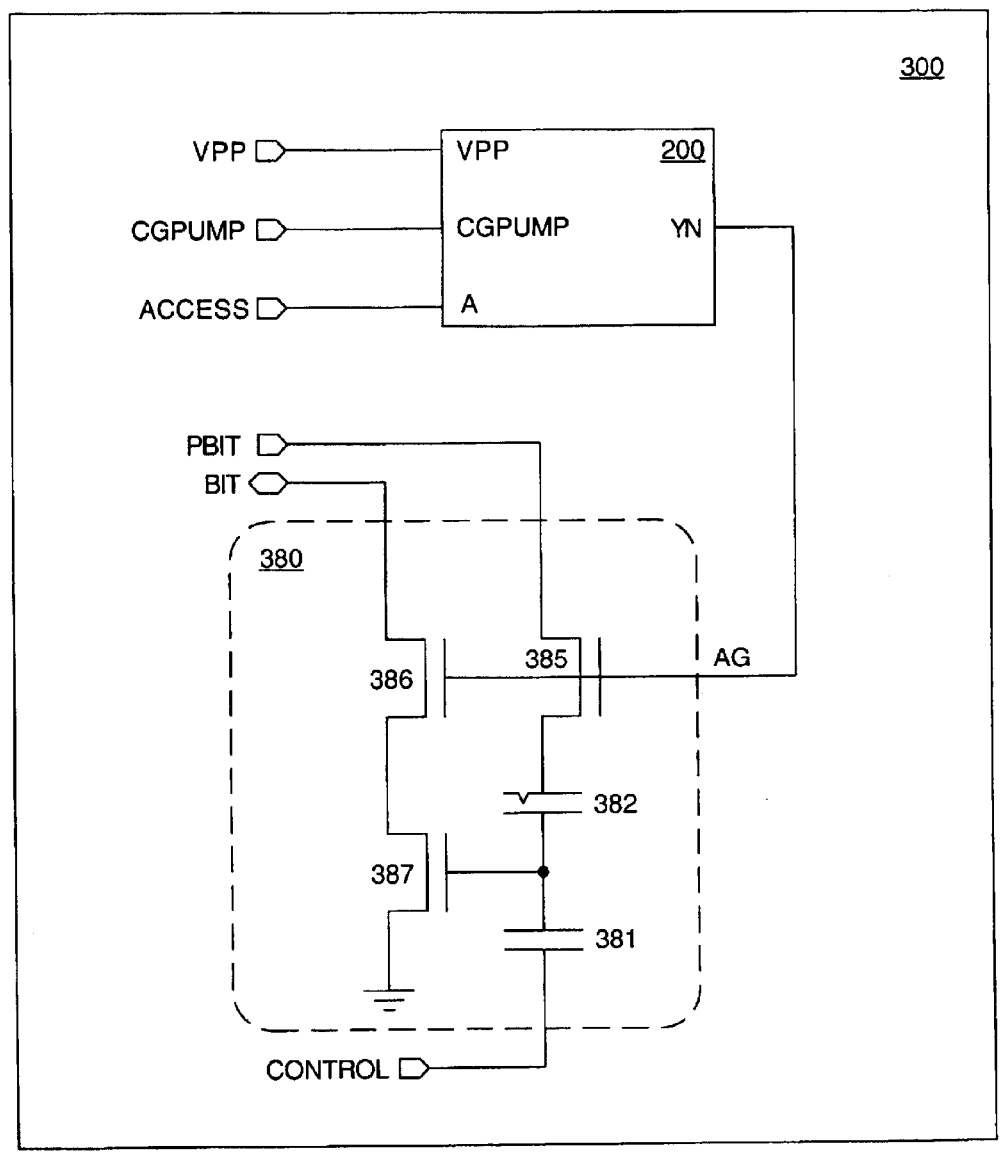
FIG. 3 shows an integrated circuit including a level shifter and a nonvolatile memory cell.

FIG. 3 shows an example of the level shifter being used in conjunction with a nonvolatile memory cell 380 on an IC 300. In the example shown, memory cell 380 comprises a control gate 381 (controlled by a CONTROL input), a tunnel capacitor 382, access gates 385 and 386 (coupled to signals PBIT and BIT, respectively), and transistor 387. Other embodiments for memory cells are well known to those of ordinary skill in the art. Input A of level shifter 200 is a ACCESS signal; note that if level shifter 200 is an inverting level shifter as in FIG. 2, ACCESS is an active-low signal. The ACCESS input signal is level shifted by level shifter 200. Output YN of level shifter 200 drives an AG input to memory cell 380, and is coupled to the gate terminals of access gates 385 and 386. Depending on the particular operating mode (read, write, erase, etc.) of memory cell 380, VPP is set to an appropriate voltage level (e.g., 1.8V or 12.0V). Thus, the voltage level of the ACCESS signal can be shifted to the necessary voltage for the intended operation. Although not shown in FIG. 3, input signal PBIT can also be driven by a level shifter 200. In some embodiments, IC 300 can be a programmable logic device, such as a CPLD.

Those having skill in the relevant arts of the invention will now perceive various modifications and additions that can be made as a result of the disclosure herein. For example, the level shifting circuit described herein can be used in any integrated circuit where level shifting a logic signal is useful, and can be connected to any element used in an integrated circuit. Furthermore, resistors, capacitors, pullups, pulldowns, transistors, P-channel transistors, N-channel transistors, and other components other than those described herein can be used to implement the invention. Active-high signals can be replaced with active-low signals by making straightforward alterations to the circuitry, such as are well known in the art of circuit design.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of ordinary skill in the art.

Accordingly, all such modifications and additions are deemed to be within the scope of the invention, which is to be limited only by the appended claims and their equivalents.

What is claimed is:

1. A circuit comprising:
   a first level shifting stage for shifting an input signal having an input voltage range to an intermediate signal having an intermediate voltage range; and
   a second level shifting stage for shifting the intermediate signal to an output signal having an output voltage range;
   wherein the second level shifting stage comprises a high voltage transistor that tolerates a greater voltage difference than transistors of the first level shifting stage; and
   wherein the first level shifting stage comprises:
      first and second PMOS transistors, wherein a gate of the first PMOS transistor is coupled to a drain of the second PMOS transistor, and wherein a sate of the second PMOS transistor is coupled to a drain of the first PMOS transistor;
      a first NMOS transistor, wherein a drain of the first NMOS transistor is coupled to the drain of the first PMOS transistor; and
      a second NMOS transistor, wherein a drain of the second NMOS transistor is coupled to the drain of the second PMOS transistor.

2. The circuit of claim 1 wherein the first level shifting stage comprises a low voltage transistor.

3. The circuit of claim 2 wherein the intermediate voltage range is within the safe operating voltage of the low voltage transistor.

4. The circuit of claim 1 wherein one end of the intermediate voltage range exceeds a threshold voltage of the high voltage transistor.

5. The circuit of claim 1 wherein the first level shifting stage is powered by a charge pump.

6. The circuit of claim 1 wherein the second level shifting stage comprises:
   first and second PMOS transistors, wherein a gate of the first PMOS transistor is coupled to a drain of the second PMOS transistor, and wherein a gate of the second PMOS transistor is coupled to a drain of the first PMOS transistor;
   a first NMOS transistor, wherein a drain of the first NMOS transistor is coupled to the drain of the first PMOS transistor; and
   a second NMOS transistor, wherein a drain of the second NMOS transistor is coupled to the drain of the second PMOS transistor.

7. The circuit of claim 6 wherein the output signal is provided at the gate of one of the first and second PMOS transistors.

8. The circuit of claim 1 further comprising a nonvolatile memory cell coupled to the output signal.

9. The circuit of claim 1 wherein the intermediate voltage range is equal to the output voltage range.

10. The circuit of claim 1 wherein the intermediate voltage range is less than the output voltage range.

11. The circuit of claim 1 further comprising:
    a programmable voltage supply for powering the second level shifting stage; and
    a voltage controller for selecting a voltage supplied by the programmable voltage supply.

12. The circuit of claim 1 further comprising: an output buffer stage coupled to the output signal.

13. The circuit of claim 1 wherein the intermediate signal drives an output load.

14. The circuit of claim 13 wherein the output load is an NMOS transistor, and the output signal drives a PMOS transistor.

15. An integrated circuit comprising:
    at least one circuit element taken from the group consisting of a microprocessor, a memory, non-programmable logic, programmable logic, a digital signal processor, and a transceiver; and
    a level shifter coupled to the at least one circuit element, the level shifter comprising:
        a first level shifting stage for shifting an input signal having an input voltage range to an intermediate signal having an intermediate voltage range; and
        a second level shifting stage for shifting the intermediate signal to an output signal having an output voltage range;
    wherein the second level shifting stage comprises a high voltage transistor that tolerates a greater voltage difference than transistors of the first level shifting stage: and
    wherein the first level shifting stage comprises:
        first and second PMOS transistors, wherein a gate of the first PMOS transistor is coupled to a drain of the second PMOS transistor, and wherein a gate of the second PMOS transistor is coupled to a drain of the first PMOS transistor:
        a first NMOS transistor, wherein a drain of the first NMOS transistor is coupled to the drain of the first PMOS transistor: and
        a second NMOS transistor, wherein a drain of the second NMOS transistor is coupled to the drain of the second PMOS transistor.

16. The circuit of claim 15 wherein the intermediate voltage range is equal to the output voltage range.

17. The circuit of claim 15 wherein the intermediate voltage range is less than the output voltage range.

* * * * *